(12) United States Patent
Lee et al.

(10) Patent No.: US 9,787,296 B1
(45) Date of Patent: Oct. 10, 2017

(54) DELAY CIRCUIT

(71) Applicant: SK hynix Inc., Gyeonggi-do (KR)

(72) Inventors: Sung-Eun Lee, Gyeonggi-do (KR);
Kyung-Hoon Kim, Gyeonggi-do (KR);
Myeong-Jae Park, Gyeonggi-do (KR);
Woo-Yeol Shin, Gyeonggi-do (KR);
Han-Kyu Chi, Gyeonggi-do (KR);
Yong-Ju Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/234,954

(22) Filed: Aug. 11, 2016

(30) Foreign Application Priority Data

Mar. 16, 2016 (KR) .................. 10-2016-0031495

(51) Int. Cl.
*H03K 5/159* (2006.01)
*H03K 21/38* (2006.01)
*H03K 5/00* (2006.01)

(52) U.S. Cl.
CPC ............. *H03K 5/159* (2013.01); *H03K 21/38* (2013.01); *H03K 2005/00078* (2013.01); *H03K 2005/00273* (2013.01)

(58) Field of Classification Search
CPC ........... H03K 2005/00019; H03K 5/15; H03K 5/15013; H03K 5/159; H03K 21/38
USPC .......................... 327/269, 270, 271
See application file for complete search history.

(56) References Cited

U.S. PATENT DOCUMENTS

| | | | | |
|---|---|---|---|---|
| 5,525,939 A * | 6/1996 | Yamauchi | .............. | H03K 5/135 327/107 |
| 8,078,950 B2 * | 12/2011 | Kawamura | ............. | G04F 10/00 714/814 |
| 8,164,493 B2 * | 4/2012 | Hsieh | .................... | G04F 10/005 341/110 |
| 8,446,198 B2 * | 5/2013 | Kamath | .................... | H03L 7/00 327/161 |
| 9,160,316 B2 * | 10/2015 | Terazawa | ............. | H03K 3/0315 |

FOREIGN PATENT DOCUMENTS

KR      1020140024213      2/2014

* cited by examiner

*Primary Examiner* — Jeffrey Zweizig
(74) *Attorney, Agent, or Firm* — IP & T Group LLP

(57) ABSTRACT

A delay circuit includes: a plurality of delay units that are serially coupled with each other in a form of loop and sequentially delay an input signal of the delay circuit; an input control unit that selects a delay unit to receive the input signal of the delay circuit among the plurality of the delay units; and an output control unit that controls an output signal of a predetermined delay unit among the plurality of the delay units to be outputted as an output signal of the delay circuit, when the output signal of the predetermined delay unit is enabled N times, where N is an integer equal to or greater than 0.

18 Claims, 4 Drawing Sheets

DELAY CIRCUIT

CROSS-REFERENCE TO RELATED APPLICATIONS

The present application claims priority under 35 U.S.C. 119(a) to Korean Patent Application No, 10-2016-0031495 filed on Mar. 16, 2016, which is incorporated herein by reference in its entirety.

BACKGROUND

1. Field

Exemplary embodiments of the present invention relate generally to a delay circuit used to delay a signal.

2. Description of the Related Art

A delay circuit controls the timing of an input signal to delay the input signal for a predetermined time and outputs a delayed signal. A delay circuit may be designed to delay an input signal by diverse delay values according to a set value. In a typical delay circuit, if a delay circuit is designed to control its delay value on the basis of from one delay unit value to 100 delay unit values, the delay circuit has to include at least 100 delay units each having a delay value of 1 unit.

In short, with an existing delay circuit, the area of the delay circuit has to be widened for raising the resolution of the controllable delay value in the delay circuit or increase the magnitude of the delay value that the delay circuit may support.

SUMMARY

Embodiments of the present invention are directed to a technology that allows increasing the resolution of a delay circuit without increasing its size.

In accordance with an embodiment of the present invention, a delay circuit includes: a plurality of delay units that are serially coupled with each other in a form of loop and sequentially delay an input signal of the delay circuit; an input control unit that selects a delay unit to receive the input signal of the delay circuit among the plurality of the delay units; and an output control unit that controls an output signal of a predetermined delay unit among the plurality of the delay units to be outputted as an output signal of the delay circuit, when the output signal of the predetermined delay unit is enabled N times, where N is an integer equal to or greater than 0.

The input control unit may select a delay unit to receive the input signal of the delay circuit among the plurality of the delay units in response to a portion of bits of a delay control codes.

The output control unit may receive the other portion of the bits of the delay control code, and the N may be decided based on the other portion of the bits of the delay control code.

Each of the plurality of the delay units may include: a first selector that selects one signal between an output signal of a preceding delay unit and the input signal of the delay circuit as an input signal of the delay unit; a delay line that delays the selected signal selected in the first selector; and a second selector that transfers the output signal of the delay unit delayed by the delay line to one between a subsequent delay unit and an exit path.

The output control unit may enable one signal among a plurality of input selection signals in response to the portion of the bits of the delay control code, and the first selectors of the plurality of the delay units may select an output signal of a preceding delay unit as an input signal of a current delay unit, when an input selection signal corresponding to the current delay unit is enabled among the plurality of the input selection signals, or when an input selection signal corresponding to the current delay unit is enabled among the plurality of the input selection signals, the first selectors of the plurality of the delay units may select the input signal of the delay circuit as an input signal of the current delay unit.

The N may be decided based on the other bits of the delay control code, and the output control unit may enable a match signal when the output signal of the predetermined delay unit is enabled N times, a second selector of the predetermined delay unit among the plurality of the delay units may be controlled based on the match signal, and the other delay units may be controlled based on a signal having a fixed level.

The input control unit may include: a pulse generator that generates a pulse signal that is enabled at a moment when the input signal of the delay circuit is enabled; and a decoder that is enabled in response to the pulse signal, and enables one signal among the plurality of the input selection signals by decoding a portion of the bits of the delay control code.

The output control unit may include: a counter that counts the number of times that the output signal of the predetermined delay unit is enabled so as to produce a counting result; and a code comparator that enables the match signal when the counting result of the counter and the other bits of the delay control code have the same value.

In accordance with another embodiment of the present invention, a delay circuit includes: first to $K^{th}$ delay units that are serially coupled with each other in a form of loop and sequentially delays an input signal of the delay circuit, where K is an integer equal to or greater than 2; and an output control unit that controls an output signal of an $L^{th}$ delay unit to be outputted as an output signal of the delay circuit, when the output signal of the $L^{th}$ delay unit is enabled in a predetermined number of times, where L is an integer equal to or greater than 1 and equal to or smaller than K, wherein, an $M^{th}$ delay unit receives an input signal of the delay circuit among the first to $K^{th}$ delay units, where M is an integer equal to or greater than 1 and equal to or smaller than K.

Each of the first to $K^{th}$ delay units may include: a first selector that selects one signal between an output signal of a preceding delay unit and an input signal of an input path as an input signal of a corresponding delay unit, a delay line that delays the selected signal selected in the first selector; and a second selector that transfers an output signal of the corresponding delay unit delayed by the delay line to one between a subsequent delay unit and an exit path.

The delay circuit may further include: a pulse generation unit that generates a pulse signal enabled at a moment when the input signal of the delay circuit is enabled, wherein a first selector of the $L^{th}$ delay unit among the first to $K^{th}$ delay units is controlled based on the pulse signal, and the first selectors of the other delay units are controlled based on a signal having a fixed level.

The output control unit may include: a counter that counts an enabling bit of an output signal of the $M^{th}$ delay unit so as to produce a counting result; and a code comparator that enables a match signal when the counting result of the counter and the predetermined number of times are the same, wherein a second selector of the $M^{th}$ delay unit among the first to $K^{th}$ delay units is controlled based on the match signal, and first selectors of the other delay units are controlled based on a signal having a fixed level.

In accordance with another embodiment of the present invention, a delay circuit includes: a delay circuit comprising: a plurality of delay units serially coupled to each other in a ring shape and sequentially delay an input signal of the delay circuit; an input control unit that receives the input signal of the delay circuit to generate a plurality of input control signals each of which is assigned to each of the delay units, in response to a first bit group of a delay control code, and an output, control unit that generates an output control signal in response to a second bit group of the delay control code and an output signal of a preset delay unit selected from the delay units, wherein each delay unit receives one of an output signal of a preceding delay unit and the input signal of the delay circuit in response to an assigned input control signal, and wherein the preset delay unit outputs the output signal thereof to one of a subsequent delay unit and an exit path from which an output signal of the delay circuit is outputted, in response to the output control signal.

BRIEF DESCRIPTION OF THE DRAWINGS

These and other features and advantages of the present invention will become apparent to those skilled in the art to which the present invention belongs by describing in detail various embodiments thereof with reference to the attached drawings in which.

DETAILED DESCRIPTION

Figure 1:
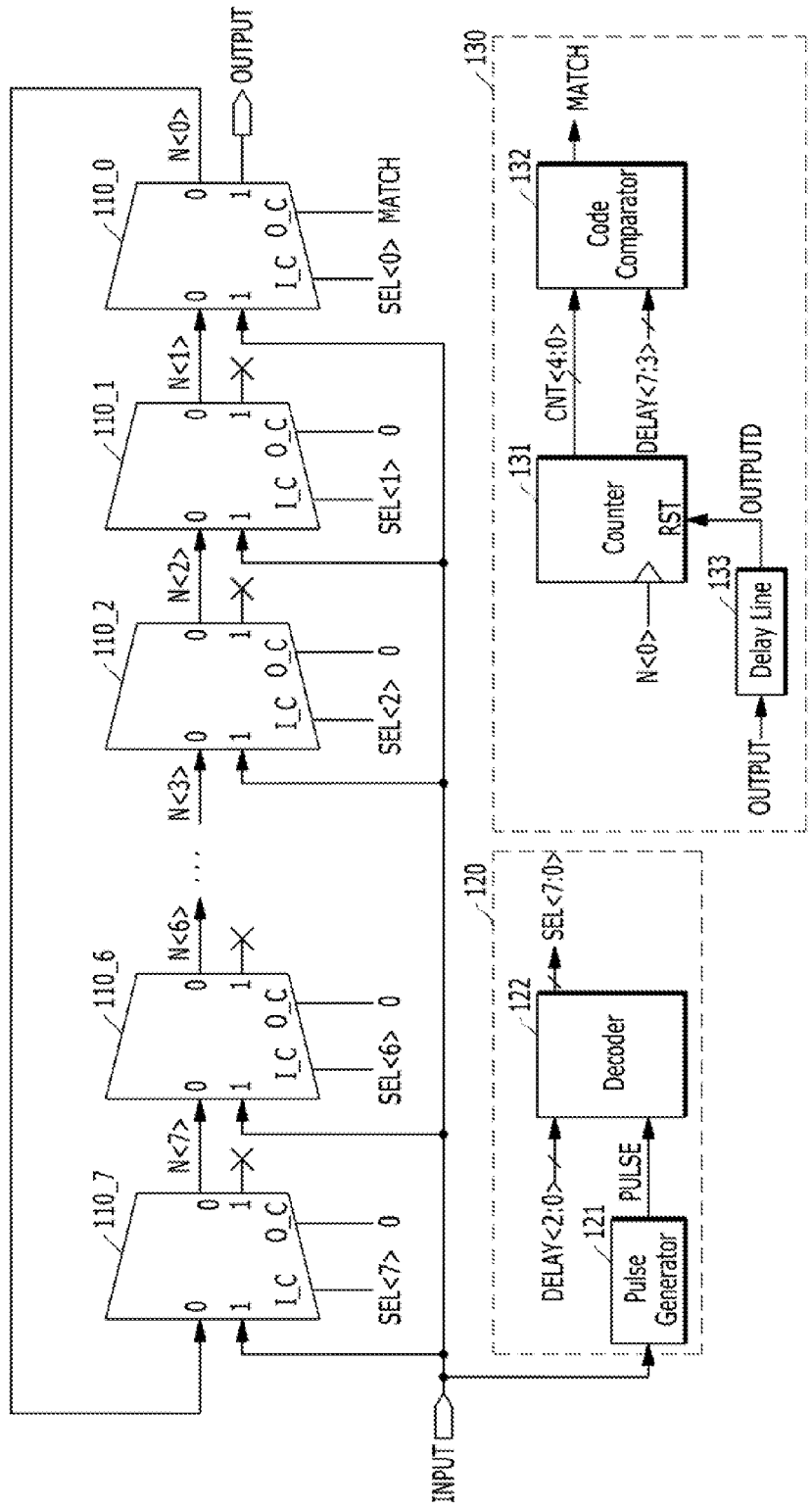
FIG. 1 is a block diagram illustrating a delay circuit, according to an embodiment of the present invention.

Although, various embodiments will be described below in more detail with reference to the accompanying drawings, we note that the present invention may also be embodied in different forms and should not be construed as being limited only to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second,", "third" and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 illustrates a delay circuit 100, according to an embodiment of the present invention.

Referring to FIG. 1, the delay circuit 100 may include a plurality of delay units 110_0 to 110_7, an input control unit 120, and an output control unit 130.

The delay units 110_0 to 110_7 may be serially coupled in a loop or ring shape for sequentially delaying an input signal INPUT of the delay circuit. Since the delay units 110_0 to 110_7 are serially coupled to each other in the loop or ring shape, it is possible to delay the input signal INPUT by making the input signal INPUT rotate the loop several times. Therefore, it is possible to realize many more diverse delay values than delay values corresponding to the number of the delay units. Generally, eight delay values are realized with 8 delay units 110_0 to 110_7, but since the delay units 110_0 to 110_7 are coupled to each other in the loop or ring shape, it becomes possible to realize many more delay values, for example, tens of or hundreds of delay values. To take an example, 18 delay values may be realized by making the input signal INPUT rotate the loop formed of the 8 delay units 110_0 to 110_7 twice and pass two more delay units.

Each of the delay units 110_0 to 110_7 may receive an output signal of its immediately preceding delay unit as its input signal when a signal of a logic low level is inputted to an input control terminal I_C. When a signal of a logic high level is inputted to the input control terminal I_C, each of the delay units 110_0 to 110_7 may receive the input signal INPUT of the delay circuit as its input signal. When a signal of a logic low level is inputted to an output control terminal O_C, each of the delay units 110_0 to 110_7 may output its output signal to its subsequent delay unit. When a signal of a logic high level is inputted to the output control terminal O_C, each of the delay units 110_0 to 110_7 may transfer its output signal to an exit path, which is a route for exiting the loop and from which an output signal OUTPUT of the delay circuit is outputted. FIG. 1 exemplarily shows that the output control terminals O_C of the delay units 110_1 to 110_7 receive a fixed value of '0' and thus the delay units 110_1 to 110_7 do not use the exit path but the delay unit 110_0 alone uses the exit path under the control of the output control unit 130.

The input control unit 120 may select a delay unit to receive the input signal INPUT of the delay circuit among the delay units 110_0 to 110_7. The input control unit 120 may generate a plurality of input selection signals SEL<7:0> each of which is assigned to each of the delay units 110_1 to 110_7, and select the delay unit to receive the input signal INPUT of the delay circuit 100 by enabling one of the input selection signals SEL<7:0> in response to a first bit group DELAY<2:0> of a delay control code DELAY<7:0>. Herein, the delay control code DELAY<7:0> may be a code for setting up a delay value of the delay circuit 100, and the plurality of input selection signals SEL<7:0> may be inputted to the input control terminals I_C of the delay units 110_0 to 110_7, respectively.

The input control unit 120 may include a pulse generator 121 and a decoder 122. The pulse generator 121 may generate a pulse signal PULSE that is enabled for a given duration when the input signal INPUT of the delay circuit 100 is enabled. The decoder 122 may be enabled when the pulse signal PULSE is enabled, and enable one input selection signal among the input selection signals SEL<7:0> by decoding the first bit group DELAY<2:0> of the delay control code DELAY<7:0>. When the pulse signal PULSE is disabled, the decoder 122 is disabled and all the input selection signals SEL<7:0> may be disabled.

The output control unit 130 may be a constituent element for deciding how many times the input signal INPUT of the delay circuit has to circulate the loop which is formed of the delay units 110_0 to 110_7. When an output signal N<0> of one delay unit 110_0, which is preset among the delay units 110_0 to 110_7, is enabled N times, N being an integer equal to or greater than 0, the output control unit 130 may control the output signal N<0> of the delay unit 110_0 to be outputted through the exit path and eventually outputted as the output signal OUTPUT of the delay circuit 100. Although FIG. 1 shows an example where the output control unit 130 controls the delay unit 110_0, it is obvious to those skilled in the art that the output control unit 130 may control any delay unit.

The output control unit 130 may include a counter 131, a code comparator 132, and a delay line 133. The counter 131 may count the number of times that the output signal N<O> of the delay unit 110_0 is enabled and output a counting result CNT<4:0>. The code comparator 132 may enable a match signal MATCH when the counting result CNT<4:0> of the counter 131 coincides with a second bit group DELAY<7:3> of the delay control code DELAY<7:0>. Here, the first bit group DELAY<2:0> may include lower bits of the delay control code DELAY<7:0>, and the second bit group DELAY<7:3> may include upper bits of the delay control code DELAY<7:0>. The match signal MATCH may be inputted to the output control terminal O_C of the delay unit 110_7. The delay line 133 delays the output signal OUTPUT of the delay circuit to generate a delayed output signal OUTPUTD. The delayed output signal OUTPUTD may be inputted to a reset terminal RST to reset the counter 131.

The delay circuit may be controlled variably to provide variable delay values, by the input control unit 120 deciding a delay unit to receive the input signal INPUT of the delay circuit 100 and the output control unit 130 deciding how many times the input signal INPUT of the delay circuit has to circulate the loop. For example, when the input control unit 120 enables an input selection signal SEL<3> and the output control unit 130 decides that the input signal INPUT has to circulate the loop three times more after being delayed by the delay units 110_0 to 110_3, the total delay value comes to 28 (which is equal to 4+3*8). Herein, a delay value '1' signifies a delay value of one delay unit.

Figure 2:
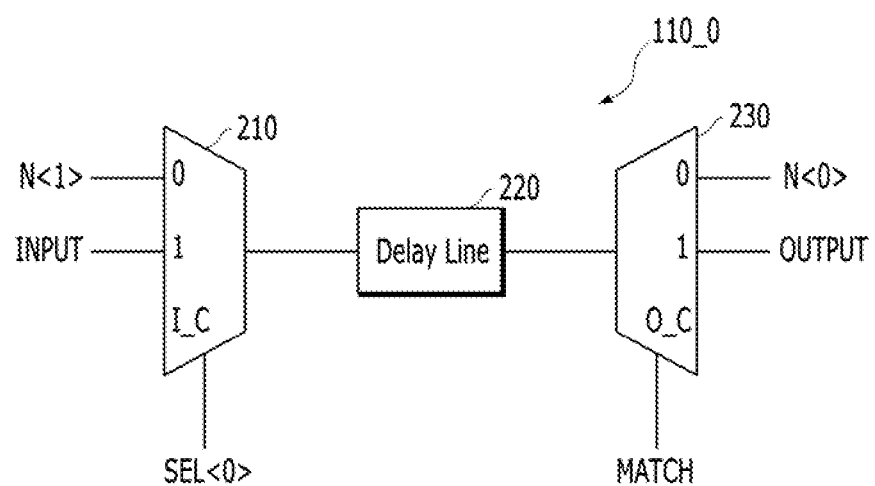
FIG. 2 is a block diagram illustrating an example configuration of a delay unit shown in FIG. 1.

FIG. 2 is a block diagram illustrating an example configuration of the delay unit 110_0 shown in FIG. 1. Since the other delay units 110_1 to 110_7 may have the same structure as that of the delay unit 110_0, only the delay unit 110_0 is explained in FIG. 2 as an example.

Referring to FIG. 2, the delay unit 110_0 may include a first selector 210, a delay line 220, and a second selector 230.

The first selector 210 may select one of an output signal N<1> of the preceding delay unit 110_1 and the input signal INPUT in response to an input selection signal SEL<0> inputted to the input control terminal I_C.

The delay line 220 may delay a signal selected by the first selector 210. Since the first selector 210 and the second selector 230 may have a slight delay value, the delay line 220 may be omitted when the delay value of the delay unit 110_0 is designed to be very small.

The second selector 230 may output a signal delayed by the delay line 220, as the output signal N<0> of the delay unit 110_0, to the subsequent delay unit 110_7 and the exit path in response to the match signal MATCH inputted to the output control terminal O_C. The output signal N<O> of the delay unit 110_0 transferred to the exit path may be the output signal OUTPUT of the delay circuit.

Figure 3:
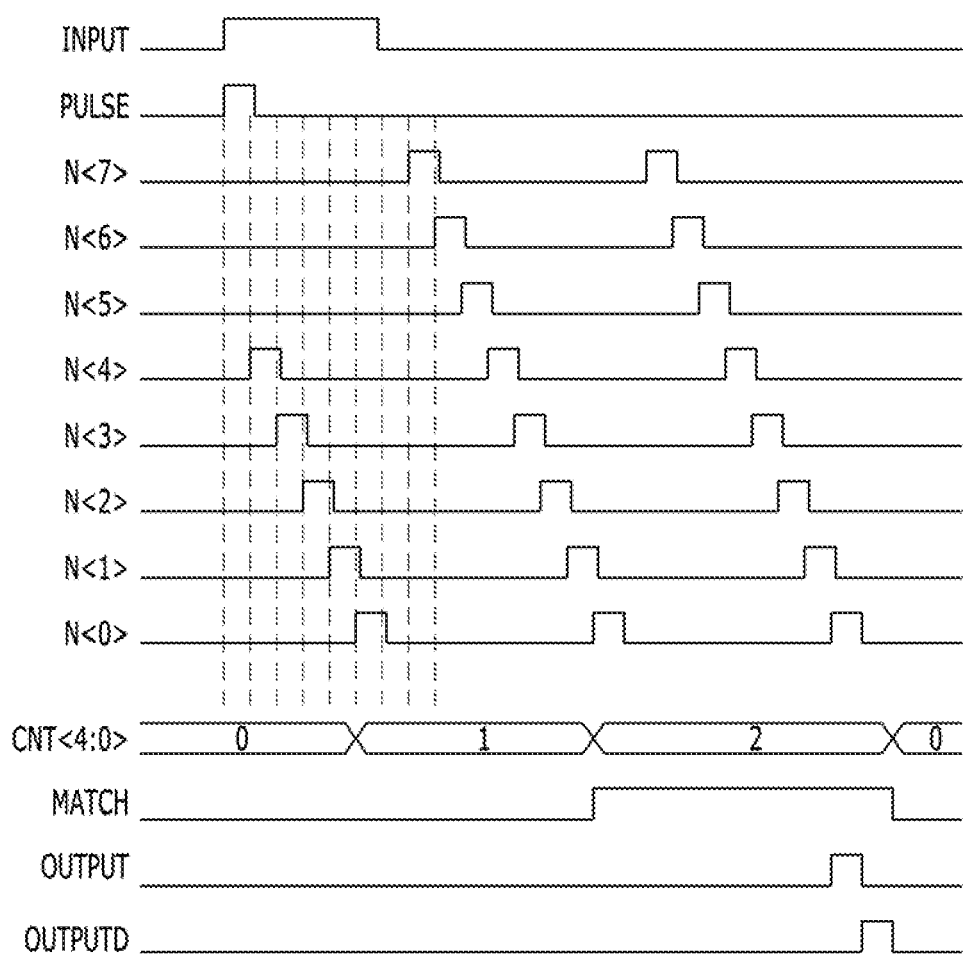
FIG. 3 is a timing diagram illustrating an operation of the delay circuit shown in FIG. 1, according to an embodiment of the present invention.

FIG. 3 is a timing diagram illustrating an operation of the delay circuit 100 shown in FIG. 1. It is assumed in FIG. 3 that the first bit group DELAY<2:0> of the delay control code DELAY<7:0> has a value '4' (based on a decimal number) and thus an input selection signal SEL<4> is enabled and the second bit group DELAY<7:3> of the delay control code DELAY<7:0> has a value '2' (based on a decimal number).

Referring to FIG. 3, the input signal INPUT of the delay circuit 100 may be enabled. In response to the enabling of the input signal INPUT, the pulse signal PULSE may be enabled for a given duration.

In a duration where the pulse signal PULSE is enabled, the input signal INPUT may be inputted to the delay unit 110_4. The input signal INPUT is delayed by the delay unit 110_4 and the output signal N<4> of the delay unit 110_4 may be enabled. The input signal INPUT may sequentially pass through the delay units 110_0 to 110_3 and thereby sequentially enable the output signals N<3>, N<2>, N<1> and N<0> of the delay units 110_0 to 110_3.

When the output signal N<0> of the delay unit 110_0 is enabled, the counting result CNT<4:0> of the counter 131 changes into '1' from '0' (based on a decimal number). Since the match signal MATCH is maintained in a disabling state until the counting result CNT<4:0> reaches the same value, which is '2', as the second bit group DELAY<7:3> of the delay control code DELAY<7:0>, the input signal INPUT may circulate the loop formed of the delay units 110_0 to 110_7. After all, the input signal INPUT gets out of the loop through the exit path of the delay unit 110_0 after circulating the loop two times. In short, the input signal INPUT of the delay circuit 100 may be outputted as the output signal OUTPUT after the input signal INPUT passes through the delay units 110_0 to 110_7 and then circulates the loop two times.

When the moment that the input signal INPUT of the delay circuit 100 is enabled is compared with the moment when the output signal OUTPUT is enabled, the delay value difference becomes 21 (=5+2×8).

Figure 4:
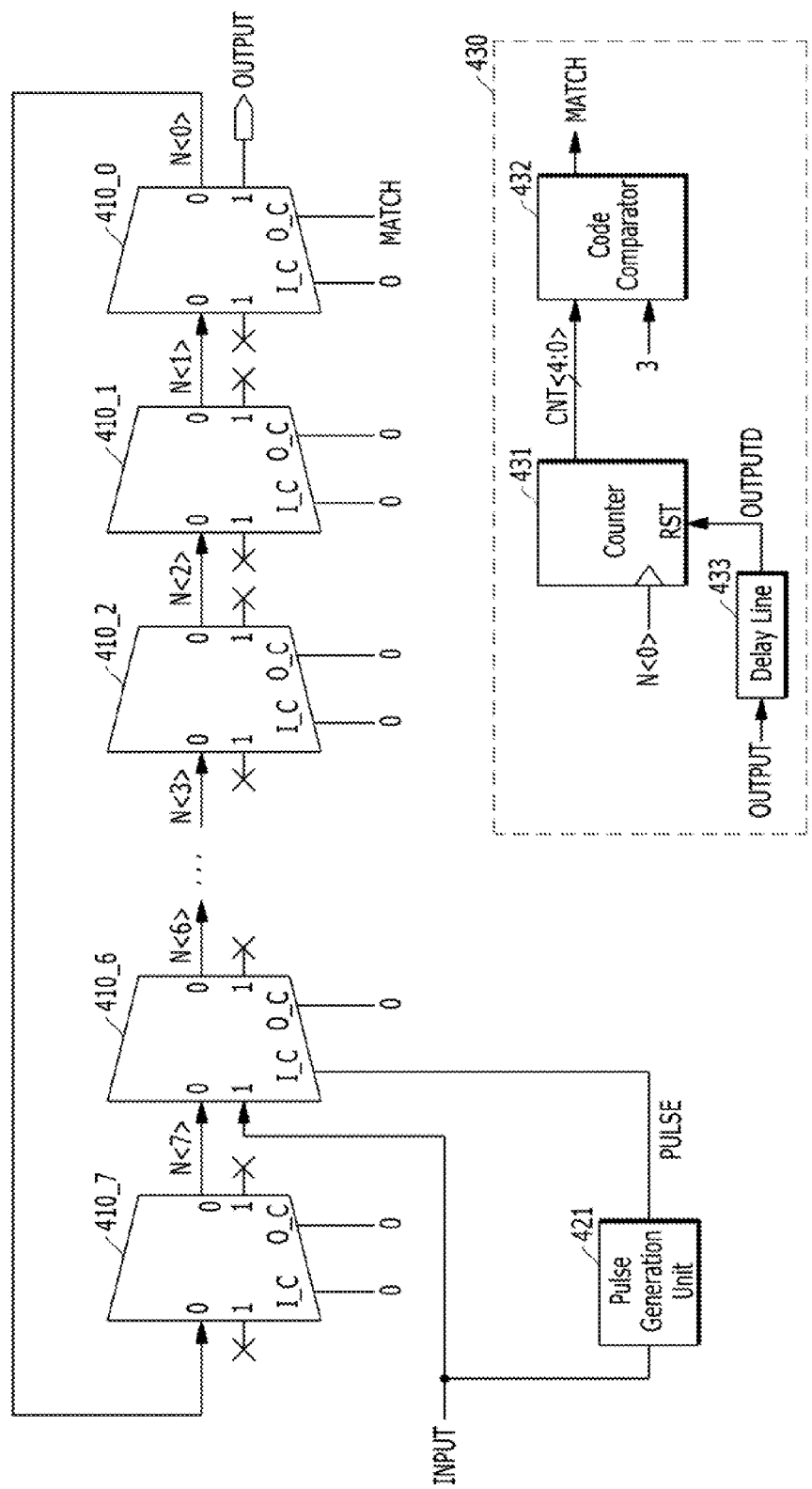
FIG. 4 is a block diagram illustrating a delay circuit, according to an embodiment of the present invention.

FIG. 4 is a block diagram illustrating a delay circuit 400, according to an embodiment of the present invention. The delay circuit 400 has a simpler structure compared to the delay circuit 100 of FIG. 1. The delay circuit 400 does not support the generation of as many diverse delay values as the circuit 100.

Referring to FIG. 4, the delay circuit may include a plurality of delay units 410_0 to 410_7, a pulse generation unit 421, and an output control unit 430.

The delay units 410_0 to 410_7 may have the same structure as the delay units 110_0 to 110_7 shown in FIG. 1 except that the delay unit 410_6 is already chosen to receive an input signal INPUT. A fixed value of '0' may be inputted to input control terminals I_C of the delay units 410_0 to 410_5 and 410_7. A pulse signal PULSE is inputted to the input control terminal I_C of the delay unit 410_6 so that the input signal INPUT may be inputted to the delay unit 410_6 when the input signal INPUT is enabled.

Each of the delay units 410_0 to 410_7 may include a first selector, a delay line, and a second selector as shown in FIG. 2. The delay units 410_0 to 410_7 of FIG. 4 are different from those of FIG. 1 in that a first selector of the delay unit 410_6 is controlled based on the pulse signal PULSE, but first selectors of the delay units 410_0 to 410_5 and 410_7 is controlled based on a signal having a fixed level of '0'. Accordingly, each of the first selectors of the delay units 410_0 to 410_5 and 410_7 may receive an output signal of a preceding delay unit.

The pulse generation unit 421 may generate the pulse signal PULSE that is enabled for a given duration when the input signal INPUT is enabled.

The output control unit 430 may have the same structure as the output control unit 130 shown in FIG. 1. That is, the output control unit 430 may include a counter 431, a code comparator 432, and a delay line 433. However, the delay circuit of FIG. 4 is different from that of FIG. 1 in that the code comparator 432 has a fixed value, which is '3' in the example of FIG. 4, instead of a variable value.

As a result, the delay circuit of FIG. 4 may have a fixed delay value of 31 (=7+3×8).

According to the embodiments of the present invention, the area of a delay circuit may be reduced while the resolution of the delay circuit is raised.

While the present invention has been described with respect to the specific embodiments, it will be apparent to those skilled in the art that various changes and modifications may be made without departing from the spirit and scope of the invention as defined in the following claims.

What is claimed is:

1. A delay circuit comprising:
   a plurality of delay units that are serially coupled to each other in a loop suitable for sequentially delaying an input signal of the delay circuit;
   an input control unit suitable for selecting a delay unit to receive the input signal of the delay circuit among the plurality of the delay units; and
   an output control unit suitable for controlling an output signal of a preset delay unit among the plurality of the delay units to be outputted as an output signal of the delay circuit, when the output signal of the preset delay unit is enabled N times, where N is an integer equal to or greater than 0,
   wherein the input control unit selects a delay unit to receive the input signal of the delay circuit among the plurality of the delay units in response to a first bit group of a delay control code.

2. The delay circuit of claim 1, wherein the output control unit receives a second bit group of the delay control code to decide the N based on the second bit group of the delay control code.

3. The delay circuit of claim 1, wherein each of the plurality of the delay units includes:
   a first selector that selects one of an output signal of a preceding delay unit and the input signal of the delay circuit as an input signal of a corresponding delay unit;
   a delay line that delays a signal selected by the first selector; and
   a second selector that outputs a signal delayed by the delay line, as an output signal of the corresponding delay unit, to one of a subsequent delay unit and an exit path from which the output signal of the delay circuit is outputted.

4. The delay circuit of claim 3, wherein the input control unit generates a plurality of input selection signals each of which is assigned to each of the delay units, and enables one of the input selection signals in response to flail the first bit group of the delay control code, and
   each of the first selectors of the plurality of the delay units selects the output signal of the preceding delay unit as the input signal of the corresponding delay unit, when the assigned input selection signal is disabled, and
   when the assigned input selection signal is enabled, each of the first selectors of the plurality of the delay units selects the input signal of the delay circuit as the input signal of the corresponding delay unit.

5. The delay circuit of claim 3, wherein the N is decided based on a second bit group of a delay control code, and
   the output control unit enables a match signal when the output signal of the preset delay unit is enabled N times, and
   a second selector of the preset delay unit among the plurality of delay units is controlled based on the match signal, and second selectors of the other delay units are controlled based on a signal having a fixed level.

6. The delay circuit of claim 1, wherein the input control unit includes:
   a pulse generator suitable for generating a pulse signal that is enabled for a given duration when the input signal of the delay circuit is enabled; and
   a decoder suitable for being enabled in response to the pulse signal, generating a plurality of input selection signals each of which is assigned to each of the delay units and enabling one of the input selection signals by decoding flail the first bit group of flail the delay control code.

7. The delay circuit of claim 1, wherein the output control unit includes:
   a counter suitable for counting the number of times that the output signal of the preset delay unit is enabled to produce a counting result; and
   a code comparator suitable for enabling a match signal for controlling the output signal of the preset delay unit to be outputted as the output signal of the delay circuit, when the counting result and a second bit group of flail the delay control code have the same value.

8. The delay circuit of claim 7, wherein the output control unit further includes:

a delay line that delays the output signal of the delay circuit to generate a delayed output signal for resetting the counter.

9. A delay circuit comprising:

first to $K^{th}$ delay units that are serially coupled to each other in a loop for sequentially delaying an input signal of the delay circuit, where K is an integer equal to or greater than 2; and an output control unit suitable for controlling an output signal of an $L^{th}$ delay unit to be outputted as an output signal of the delay circuit, when the output signal of the $L^{th}$ delay unit is enabled in a predetermined number of times, where L is an integer equal to or greater than 1 and equal to or smaller than K, wherein an $M^{th}$ delay unit receives the input signal of the delay circuit among the first to $K^{th}$ delay units, where M is an integer equal to or greater than 1 and equal to or smaller than K, wherein each of the first to $K^{th}$ delay units includes:
 a first selector suitable for selecting one of an output signal of a preceding delay unit and the input signal of the delay circuit as an input signal of a corresponding delay unit;
 a delay line suitable for delaying a signal selected by the first selector; and
 a second selector suitable for outputting a signal delayed by the delay line, as an output signal of the corresponding delay unit, to one of a subsequent delay unit and an exit path from which the output signal of the delay circuit is outputted.

10. The delay circuit of claim 9, further comprising:

a pulse generation unit suitable for generating a pulse signal enabled for a given duration when the input signal of the delay circuit is enabled, wherein a first selector of the $M^{th}$ delay unit among the first to $K^{th}$ delay units is controlled based on the pulse signal, and first selectors of the other delay units are controlled based on a signal having a fixed level.

11. The delay circuit of claim 9, wherein the output control unit includes:

a counter suitable for counting the number of times that the output signal of the $L^{th}$ delay unit is enabled to produce a counting result; and a code comparator suitable for enabling a match signal when the counting result and the predetermined number of times are the same, wherein a second selector of the $L^{th}$ delay unit among the first to $K^{th}$ delay units is controlled based on the match signal, and second selectors of the other delay units are controlled based on a signal having a fixed level.

12. A delay circuit comprising:

a plurality of delay units serially coupled to each other in a ring shape and sequentially delay an input signal of the delay circuit;

an input control unit suitable for receiving the input signal of the delay circuit to generate a plurality of input control signals each of which is assigned to each of the delay units, in response to a first bit group of a delay control code; and an output control unit suitable for generating an output control signal in response to a second bit group of the delay control code and an output signal of a preset delay unit selected from the delay units, wherein each delay unit receives one of an output signal of a preceding delay unit and the input signal of the delay circuit in response to an assigned input control signal, and wherein the preset delay unit outputs the output signal thereof to one of a subsequent delay unit and an exit path from which an output signal of the delay circuit is outputted, in response to the output control signal.

13. The delay circuit of claim 12, wherein the output control unit that enables the output control signal when an activation number of the output signal of the preset delay unit is equal to a value which is set in response to the second bit group of the delay control code.

14. The delay circuit of claim 12, wherein each of the plurality of the delay units includes:

a first selector suitable for selecting one of the output signal of the preceding delay unit and the input signal of the delay circuit as an input signal of a corresponding delay unit in response to the assigned input control signal;

a delay line suitable for delaying a signal selected by the first selector; and a second selector suitable for outputting a signal delayed by the delay line, as an output signal of the corresponding delay unit, to one of the subsequent delay unit and the exit path.

15. The delay circuit of claim 14, wherein a second selector of the preset delay unit is controlled in response to the output control signal, and second selectors of the other delay units are controlled in response to a signal having a fixed level.

16. The delay circuit of claim 12, wherein the input control unit includes:

a pulse generator suitable for generating a pulse signal that is enabled for a given duration when the input signal of the delay circuit is enabled; and a decoder suitable for being enabled in response to the pulse signal, and generating the input control signals by decoding the first bit group of the delay control code.

17. The delay circuit of claim 12, wherein the output control unit includes:

a counter suitable for counting an activation number of the output signal of the preset delay unit to output a counting result; and a code comparator suitable for enabling the output control signal when the counting result is equal to a value which is set in response to the second bit group of the delay control code.

18. The delay circuit of claim 17, wherein the output control unit further includes:

a delay line suitable for delaying the output signal of the delay circuit to generate a delayed output signal for resetting the counter.

* * * * *